United States Patent
Khalil et al.

(10) Patent No.: US 10,103,233 B1
(45) Date of Patent: Oct. 16, 2018

(54) TRANSISTOR DIE WITH DRAIN VIA ARRANGEMENT, AND METHODS OF MANUFACTURE THEREOF

(71) Applicant: NXP USA, Inc., Austin, TX (US)

(72) Inventors: Ibrahim Khalil, Chandler, AZ (US); David Cobb Burdeaux, Chandler, AZ (US); Damon Holmes, Chandler, AZ (US); Hernan Rueda, Chandler, AZ (US); Partha Sarathi Chakraborty, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/721,588

(22) Filed: Sep. 29, 2017

(51) Int. Cl.
| | |
|---|---|
| *H01L 29/417* | (2006.01) |
| *H01L 29/08* | (2006.01) |
| *H01L 23/532* | (2006.01) |
| *H01L 23/528* | (2006.01) |
| *H01L 29/423* | (2006.01) |
| *H01L 23/522* | (2006.01) |
| *H01L 29/78* | (2006.01) |
| *H01L 23/047* | (2006.01) |

(Continued)

(52) U.S. Cl.
CPC .... *H01L 29/41775* (2013.01); *H01L 23/5226* (2013.01); *H01L 23/5283* (2013.01); *H01L 23/53238* (2013.01); *H01L 29/0847* (2013.01); *H01L 29/41758* (2013.01); *H01L 29/4238* (2013.01); *H01L 23/047* (2013.01); *H01L 23/49558* (2013.01); *H01L 23/49575* (2013.01); *H01L 24/48* (2013.01); *H01L 24/49* (2013.01); *H01L 29/7816* (2013.01); *H01L 2224/48091* (2013.01); *H01L 2224/48137* (2013.01); *H01L 2224/49096* (2013.01); *H01L 2224/49112* (2013.01); *H01L 2224/49175* (2013.01)

(58) Field of Classification Search
CPC ............ H01L 29/417; H01L 29/41775; H01L 29/41748; H01L 29/4238; H01L 23/5226; H01L 23/5283
See application file for complete search history.

(56) References Cited

U.S. PATENT DOCUMENTS

| | | | |
|---|---|---|---|
| 5,912,490 A | 6/1999 | Hebert et al. | |
| 6,108,049 A | * 8/2000 | Limberg | ............. H04B 1/7093 348/555 |

(Continued)

FOREIGN PATENT DOCUMENTS

WO      2006028793 A1     3/2006

*Primary Examiner* — Phuc Dang
(74) *Attorney, Agent, or Firm* — Sherry W. Schumm

(57) ABSTRACT

An embodiment of a transistor die includes a semiconductor substrate a drain region, a channel region, a drain terminal, and a conductive gate tap. The conductive gate tap includes a distal end that is coupled to a gate structure over the channel region. A first segment of the drain region is adjacent to the distal end of the gate tap. The drain terminal includes a drain runner formed from one or more portions of the patterned conductive layers. A plurality of drain pillars electrically connects the drain runner to second and third segments of the drain region, and a plurality of second drain pillars electrically connect the drain runner and the third drain region segment. The build-up structure over the second drain region segment between the first and second drain pillars is devoid of electrical connections between the drain runner and the drain region.

20 Claims, 11 Drawing Sheets

(51) Int. Cl.
*H01L 23/495* (2006.01)
*H01L 23/00* (2006.01)

(56) References Cited

U.S. PATENT DOCUMENTS

| | | |
|---|---|---|
| 6,306,712 B1 | 10/2001 | Rodder et al. |
| 6,566,708 B1 | 5/2003 | Grover et al. |
| 2001/0036713 A1 | 11/2001 | Rodder et al. |
| 2006/0043479 A1 | 3/2006 | Parris et al. |
| 2011/0102077 A1* | 5/2011 | Lamey ................ H01L 23/4824 |
| | | 327/594 |
| 2015/0255596 A1 | 9/2015 | Cai |
| 2016/0153932 A1* | 6/2016 | Eklund ................ G01N 27/414 |
| | | 257/253 |
| 2017/0194491 A1* | 7/2017 | Zhang ................ H01L 29/0882 |

* cited by examiner

US 10,103,233 B1

TRANSISTOR DIE WITH DRAIN VIA ARRANGEMENT, AND METHODS OF MANUFACTURE THEREOF

TECHNICAL FIELD

Embodiments of the subject matter described herein relate generally to transistor die, and more particularly to field effect transistors with elongated transistor fingers.

BACKGROUND

A typical solid state field effect transistor (FET) has gate, source, and drain contact structures, each of which are electrically connected to a corresponding channel region, source region, and drain region, respectively, within a semiconductor substrate. Bond pads are electrically connected to the drain and gate contact structures to provide for external connectivity to the FET.

The physical proximity of the gate and drain contact structures leads to electromagnetic coupling between the structures, and more particularly to parasitic feedback capacitance between the gate and drain structures, referred to as $C_{gd}$. $C_{gd}$ is a critical parameter, and relatively high $C_{gd}$ values contribute to device performance degradation, especially at higher frequencies. More particularly, device gain and stability may be detrimentally affected in device designs with relatively high $C_{gd}$.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Some field effect transistor (FET) devices include a plurality of parallel transistor "fingers", each of which includes elongated source, drain, and channel regions. In such FET devices, a drain contact structure may include a plurality of regularly-spaced, vertical interconnects that provide electrical connectivity between the drain region and an elongated, conductive drain runner formed from a portion of an upper metal layer. For example, the vertical interconnects may include conductive drain "pillars" that are formed from stacked, vertically-aligned vias that extend from the drain region at the semiconductor substrate surface to the drain runner.

A plurality of spaced-apart gate contact structures, referred to as gate "tap" structures, electrically connect at tap points along an elongated gate, which is positioned over the elongated channel region. Electromagnetic coupling between the gate tap structures and the drain pillars results in parasitic feedback capacitance between the gate and drain structures, or $C_{gd}$. As discussed above, a relatively high $C_{gd}$ may detrimentally affect device performance.

As described below, embodiments of transistor devices with unique gate and drain contact structures may have a reduced $C_{gd}$, when compared with conventional FET devices. In particular, embodiments include devices with drain contact structures having irregularly arranged drain pillars. More specifically, although drain pillars are present along much of the length of a drain runner, drain pillars are excluded from the drain contact structures in areas that are adjacent to the gate tap structures (e.g., in areas that are within a "keep out" distance between the gate tap structures and the drain pillars). Because the physical distance between the gate tap structures and the nearest drain pillar is greater, when compared with conventional devices, these embodiments may result in reduced $C_{gd}$, when compared with such conventional devices. Accordingly, these embodiments may have improved device gain and stability, when compared with the conventional devices. The reduced feedback capacitance may have other beneficial effects, as well.

Figure 1:
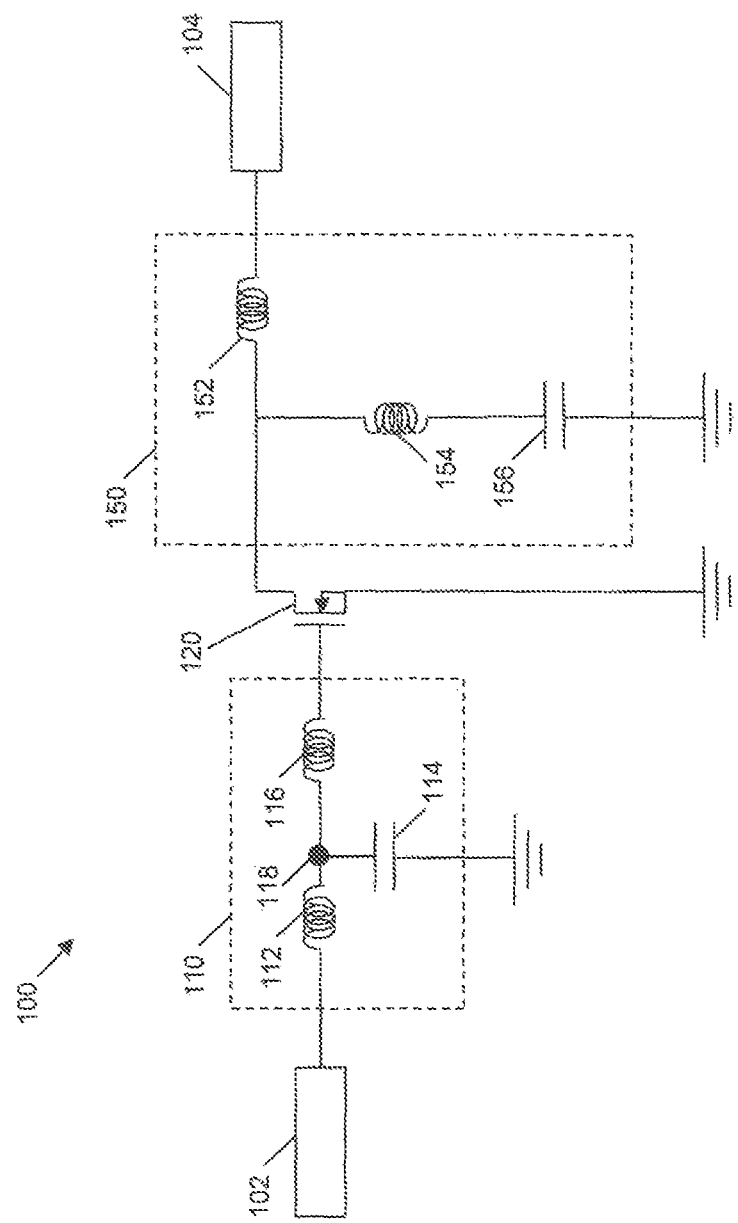
FIG. 1 is a schematic diagram of an RF amplifier device, in accordance with an example embodiment.

Before discussing the details of the transistor device embodiments, example amplifier circuits and power transistor devices are first discussed in connection with FIGS. 1-3 to give context to the inventive embodiments. FIG. 1 is a schematic diagram of an RF amplifier device 100, in accordance with an embodiment. Essentially, device 100 forms a portion of an amplifier, which is configured to increase the power of an RF signal input to the device. The embodiments illustrated herein and described below correspond to a single-stage amplifier, in which a single transistor (e.g., transistor 120) is used to amplify the RF signal. Embodiments of the inventive subject matter also may be applied in multiple-stage (e.g., two-stage) amplifiers, in which a first transistor of a pre-amplifier stage amplifies the input RF signal, and a second amplifier of a final amplifier stage receives and further amplifies the RF signal output from the pre-amplifier stage. For example, the multiple amplifier stages may be implemented on a single transistor die, or the amplifier stages may be implemented on separate die. Although multiple-stage amplifiers are not discussed in detail herein, embodiments of multiple-stage amplifiers are included within the scope of the inventive subject matter.

Device 100 includes an input lead 102, an input circuit 110, a transistor 120, an output circuit 150, and an output lead 104, in an embodiment. Although transistor 120 and various elements of the input and output impedance matching circuits 110, 150 are shown as singular components, the depiction is for the purpose of ease of explanation only. Those of skill in the art would understand, based on the description herein, that transistor 120 and/or certain elements of the input and output circuits 110, 150 each may be implemented as multiple components (e.g., connected in parallel or in series with each other), and examples of such embodiments are illustrated in other Figures and described later.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input circuit 110 is electrically coupled between the input lead 102 and a first terminal of transistor 120, which is also located within the device's interior, and output circuit 150 is electrically coupled between a second terminal of transistor 120 and the output lead 104.

According to an embodiment, transistor 120 is the primary active component of device 100. Transistor 120 includes a control terminal and two current-carrying terminals, where the current-carrying terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current-carrying terminal), and a source (a second current-carrying terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input circuit 110, the drain of transistor 120 is coupled to the output circuit 150, and the source of transistor 120 is coupled to ground (or another voltage reference). Through the variation of control signals provided to the gate of transistor 120 (e.g., in the form of an input RF signal), the current between the current-carrying terminals of transistor 120 may be modulated.

Input circuit 110 is configured to raise the impedance of device 100 to a higher (e.g., intermediate or higher) impedance level (e.g., in a range from about 2 to about 10 Ohms or higher). Accordingly, input circuit 110 may be considered to be an input impedance matching circuit. Input circuit 110 is coupled between the input lead 102 and the control terminal (e.g., gate) of the transistor 120. According to an embodiment, input circuit 110 includes two inductive elements 112, 116 and a shunt capacitor 114. A first inductive element 112 is coupled between input lead 102 and a first terminal of capacitor 114 (at node 118), and a second inductive element 116 is coupled between the first terminal of capacitor 114 and the control terminal of transistor 120. The second terminal of capacitor 114 is coupled to ground (or another voltage reference). Inductive elements 112, 116 each may be implemented as a plurality of parallel-coupled bondwires (e.g., bondwires 212, 216, FIG. 2). The combination of inductive elements 112, 116 and shunt capacitor 114 functions as a low-pass filter. In alternate embodiments, the combination of components forming circuit 110 may function as a high-pass filter or a bandpass filter.

Output circuit 150 is configured to match the output impedance of device 100 with the input impedance of an external circuit or component (not shown) that may be coupled to output lead 104. More specifically, output circuit 150 provides a portion of an impedance match between the transistor 120 and a load (not illustrated) to which the device 100 is coupled. Accordingly, output circuit 150 may be considered to be an output impedance matching circuit (or an output impedance "pre-match" circuit, where a remainder of the impedance matching is performed at the PCB level). Output circuit 150 is coupled between the first current-carrying terminal (e.g., drain) of transistor 120 and the output lead 104. According to an embodiment, output circuit 150 includes a series circuit coupled between the first current-carrying terminal of transistor 120 and the output lead 104, and a shunt circuit coupled between the first current-carrying terminal and a ground reference.

The series circuit includes inductive element 152 coupled between the first current-carrying terminal (e.g., drain) of transistor 120 and the output lead 104, according to an embodiment. Inductive element 152 may be implemented as a plurality of parallel-coupled bondwires (e.g., bondwires 252, FIG. 2).

The shunt circuit includes another inductive element 154 and a capacitor 156, in an embodiment. The inductive element 154 is coupled between the first current-carrying terminal of transistor 120 and a first terminal of capacitor 156. Inductive element 154 may be implemented as a plurality of parallel-coupled bondwires (e.g., bondwires 254, FIG. 2). A second terminal of the capacitor 156 is coupled to ground (or to another voltage reference), in an embodiment. The series-coupled combination of inductive element 154 and capacitor 156 functions as a high-pass filter. In alternate embodiments, circuit 150 may function as a low-pass filter or a bandpass filter.

Figure 2:
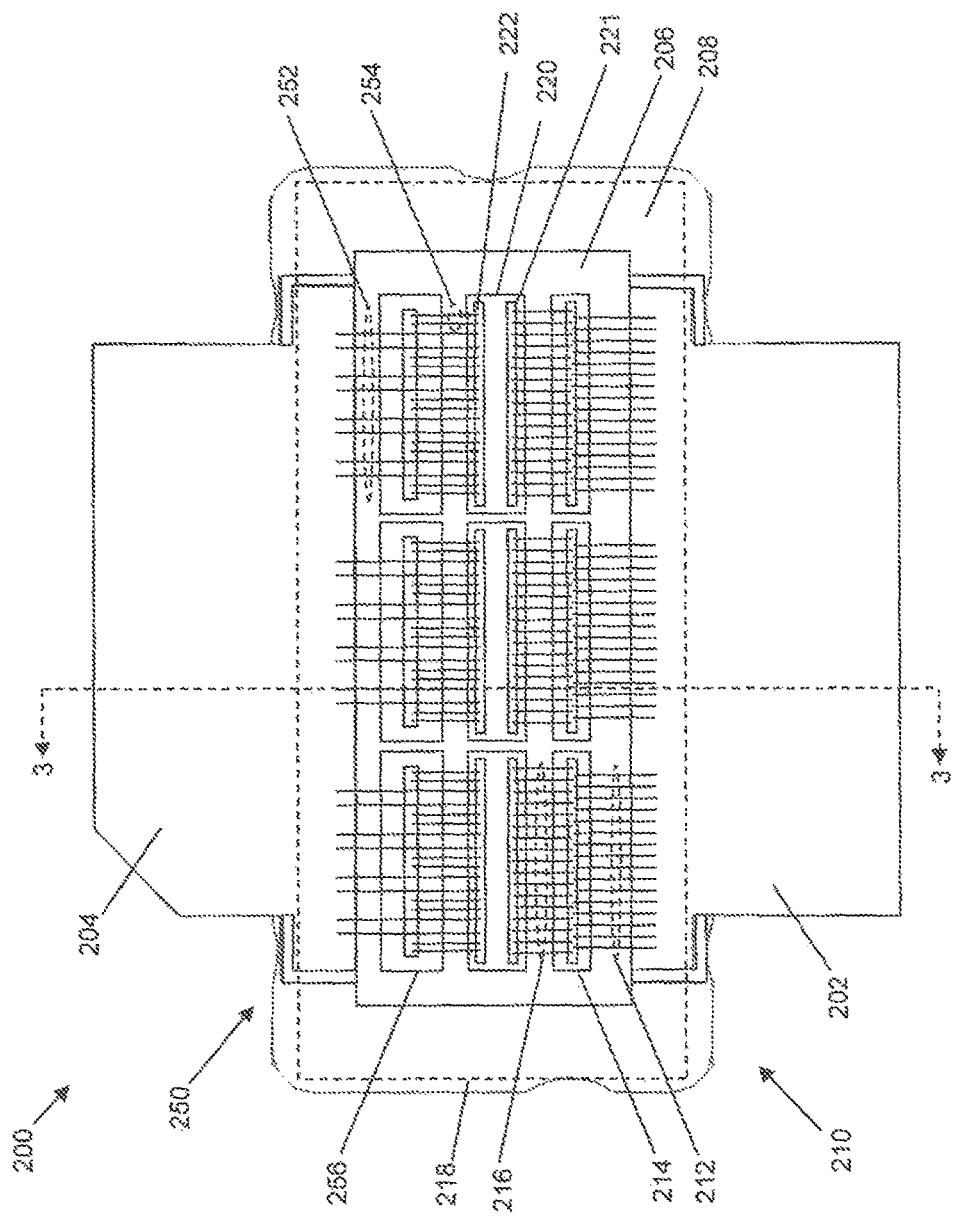
FIG. 2 is a top view of an example of a packaged RF amplifier device that embodies the circuit of FIG. 1, in accordance with an example embodiment.
Figure 3:
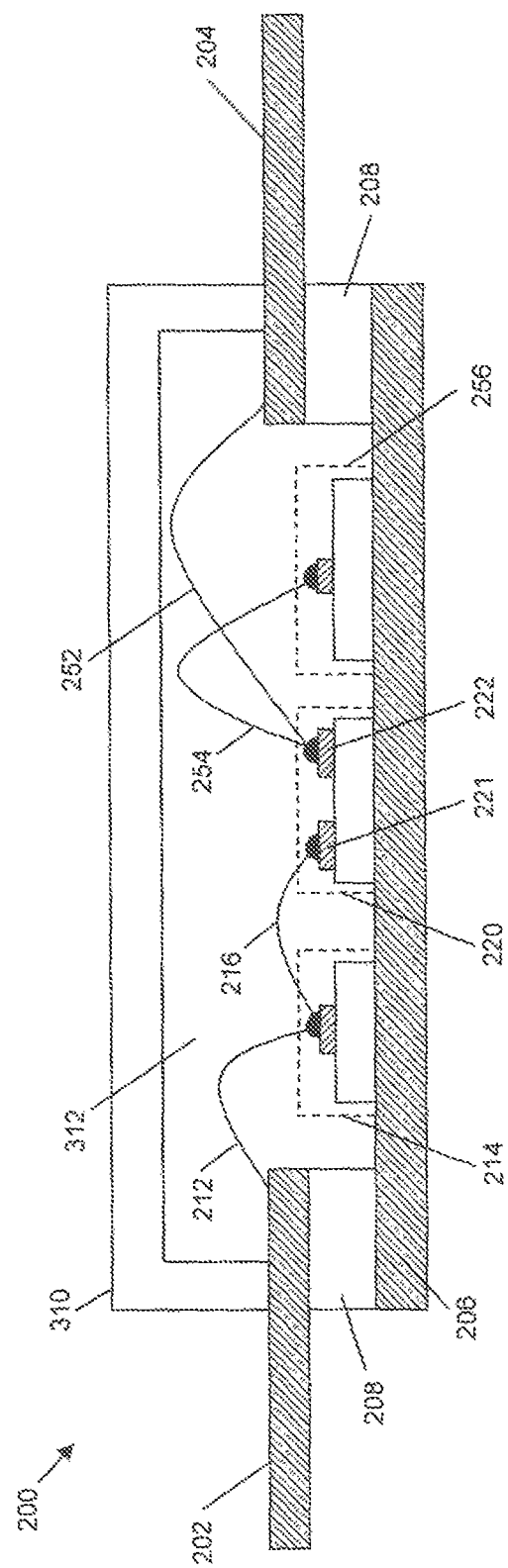
FIG. 3 is a cross-sectional, side view of the RF amplifier device of FIG. 2 along line 3-3.

FIG. 2 is a top view of an example of a packaged RF amplifier device 200 that embodies the circuit of FIG. 1, in accordance with an embodiment. More particularly, the interconnected electrical components and elements of device 200 may be modeled by the schematic diagram of FIG. 1. For enhanced understanding, FIG. 2 should be viewed in conjunction with FIG. 3, which is a cross-sectional, side view of the semiconductor device 200 of FIG. 2 along line 3-3. More specifically, FIG. 3 is a cross-sectional view through input and output leads 202, 204 and the active device area. FIG. 3 also illustrates a cap 310, which may be implemented in air cavity package embodiments to seal the interior components of device 200 within an air cavity 312. Alternatively, the interior components of the device 200 may be covered with encapsulant material.

Device 200 includes an input lead 202 (e.g., input lead 102, FIG. 1), an output lead 204 (e.g., output lead 104, FIG. 1), a flange 206, an isolation structure 208, a plurality of transistors 220 (e.g., multiple instances of transistor 120, FIG. 1), a plurality of input circuits 210 (e.g., multiple instances of input circuit 110, FIG. 1), and a plurality of output circuits 250 (e.g., multiple instances of output circuit 150, FIG. 1), all of which may be packaged together as parts of the device 200. In the example of FIG. 2, device 200 includes three amplification paths coupled between leads 202 and 204, where each amplification path includes an input circuit 210, a transistor 220, and an output circuit 250. The three amplification paths essentially function in parallel, although another semiconductor device may include one or two amplification paths or more than three amplification paths. According to an embodiment, jumper wires (not illustrated) may be electrically coupled between the multiple amplification paths, in order to provide low frequency paths between corresponding components.

According to an embodiment, device 200 is incorporated in an air cavity package, in which transistors 220 and various input and output circuit elements 212, 214, 216, 252, 254, 256 are located within an enclosed air cavity 312. Basically, the air cavity 312 is bounded by flange 206, isolation structure 208, and a cap 310 overlying and in contact with the isolation structure 208 and leads 202, 204. In FIG. 2, an example perimeter of the cap 310 is indicated by dashed box 218. In other embodiments, a device may be incorporated into an overmolded package (i.e., a package in which the electrical components within the active device area are encapsulated with a non-conductive molding compound, and in which portions of the leads 202, 204, and all or portions of the isolation structure 208 also may be encompassed by the molding compound).

Flange 206 includes a rigid electrically-conductive substrate, which has a thickness that is sufficient to provide structural support for electrical components and elements of device 200. In addition, flange 206 may function as a heat sink for transistors 220 and other devices mounted on flange 206. Flange 206 has a top and bottom surface (only a central portion of the top surface is visible in FIG. 2), and a substantially-rectangular perimeter that corresponds to the perimeter of the device 200 (e.g., to the perimeter of isolation structure 208, described below). Flange 206 is formed from a conductive material, and may be used to provide a ground reference for the device 200.

Isolation structure 208, which has a top surface and an opposed bottom surface, is attached to the top surface of flange 206. Isolation structure 208 is formed from a rigid, electrically insulating material (i.e., a material with a dielectric constant in a range from about 3.0 to about 10.0, although materials with higher or lower dielectric constants may be used).

The input and output leads 202, 204 are mounted on a top surface of the isolation structure 208 on opposed sides of the central opening, and thus the input and output leads 202, 204 are elevated above the top surface of the flange 206, and are electrically isolated from the flange 206. Generally, the input and output leads 202, 204 are oriented in order to allow for attachment of bondwires (e.g., bondwires 212, 232, 236) between the input and output leads 202, 204 and components and elements within the central opening of isolation structure 208.

Transistors 220 and various components 214, 256 of the input and output circuits 210, 250 are mounted on a generally central portion of the top surface of flange 206, which is exposed through the opening in isolation structure 208. Each transistor 220 has a control terminal (e.g., a gate terminal) and two current-carrying terminals (e.g., a drain terminal and a source terminal). Conductive landing pads 221, 222 at the top surface of each transistor 220 are electrically coupled to the control terminals and to one of the current-carrying terminals of each transistor 220, respectively. The control terminal of each transistor 220 is coupled to the input lead 202 through the input circuit 210 (e.g., through bondwires 212 and bondwires 216 of the input circuit 210). In addition, one current-carrying terminal (e.g., the drain terminal) is coupled to the output lead 204 through output circuit 250 (e.g., through bondwires 252 of the output circuit 250). The other current-carrying terminal (e.g., the source terminal) is electrically coupled to the flange 206 (e.g., to ground), in an embodiment.

The input circuit 210 (e.g., input circuit 110, FIG. 1) is coupled between the input lead 202 (e.g., input lead 102, FIG. 1) and the control terminal of the transistor 220 (e.g., transistor 120, FIG. 1). In the device 200 of FIG. 2, the input circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced bondwires. For example, a first inductive element 212 (e.g., inductive element 112, FIG. 1) includes a plurality of bondwires coupled between input lead 202 and a first terminal of capacitor 214 (e.g., a first terminal of capacitor 114, FIG. 1). A second inductive element 216 (e.g., inductive element 116, FIG. 1) includes a plurality of bondwires coupled between the first terminal of capacitor 214 and the control terminal of transistor 220. The second terminal of capacitor 214 is electrically coupled to the flange 206 (e.g., to ground). Capacitor 214 may be, for example, a discrete silicon capacitor, a discrete ceramic capacitor, or another type of capacitor. First ends of bondwires 212, 216 are attached to a conductive landing pad (not numbered, but corresponding to node 118, FIG. 1) at the top surface of capacitor 214, which in turn is electrically coupled to the first terminal of capacitor 214. Further, second ends of bondwires 216 are attached to the conductive landing pad 221 at the top surface of transistor 220, which in turn is electrically coupled to the control terminal of transistor 220.

The output circuit 250 (e.g., output impedance matching circuit 150, FIG. 1) is coupled between a first current-carrying terminal (e.g., drain) of transistor 220 (e.g., transistor 120, FIG. 1) and the output lead 204 (e.g., output lead 104, FIG. 1). In the device 200 of FIG. 2, the output circuit 250 includes two inductive elements 252, 254 (e.g., inductive elements 152, 154, FIG. 1) and one capacitor 256 (e.g., capacitor 156, FIG. 1).

Each inductive element 252, 254 is formed from a plurality of parallel, closely-spaced bondwires, in an embodiment. For example, a series inductive element 252 (e.g., inductive element 152, FIG. 1) includes a plurality of bondwires coupled between the first current-carrying terminal (e.g., the drain terminal) of transistor 220 and the output lead 204. Similarly, shunt inductive element 254 (e.g., shunt inductive element 154, FIG. 1) includes a plurality of bondwires coupled between the first current-carrying terminal of transistor 220 and the first terminal of capacitor 256. The second terminal of capacitor 256 is electrically coupled to the flange 206 (e.g., to ground). Capacitor 256 may be, for example, a discrete silicon capacitor, a discrete ceramic capacitor, or another type of capacitor.

Embodiments of field effect transistors (FETs) that are suitable for use in amplifier circuits and devices, including but not limited to circuit 100 and device 200 (FIGS. 1, 2), will now be discussed in more detail in conjunction with FIGS. 4-10. As will be explained in more detail below, an embodiment of a FET device includes a plurality of parallel transistor "fingers", each of which includes elongated source, drain, and channel regions. A plurality of spaced-apart gate contact structures, referred to as gate "tap" structures, electrically connect at tap points along an elongated gate, which is positioned over the elongated channel region.

A drain contact structure is electrically connected between the drain region and an elongated, conductive drain runner formed from a portion of an upper metal layer. The electrical connection between the drain region and the drain runner is achieved using vertical interconnects, such as conductive drain "pillars" that are formed from stacked, vertically-aligned vias that extend from the drain region at the semiconductor substrate surface to the drain runner.

According to an embodiment, the drain contact structures having irregularly arranged drain pillars. More specifically, although drain pillars are present along much of the length of a drain runner, drain pillars are excluded from the drain contact structures in areas that are adjacent to the gate tap structures (e.g., in areas that are within a "keep out" distance between the gate tap structures and the drain pillars). Because the physical distance between the gate tap structures and the nearest drain pillar is greater, when compared with conventional devices in which drain pillars are included in areas that are adjacent to gate tap structures, these embodiments may result in reduced parasitic feedback capacitance between the gate and drain structures, or $C_{gd}$, when compared with such conventional devices. Accordingly, these embodiments may have improved device gain and stability, when compared with the conventional devices. The reduced feedback capacitance may have other beneficial effects, as well.

Figure 4:
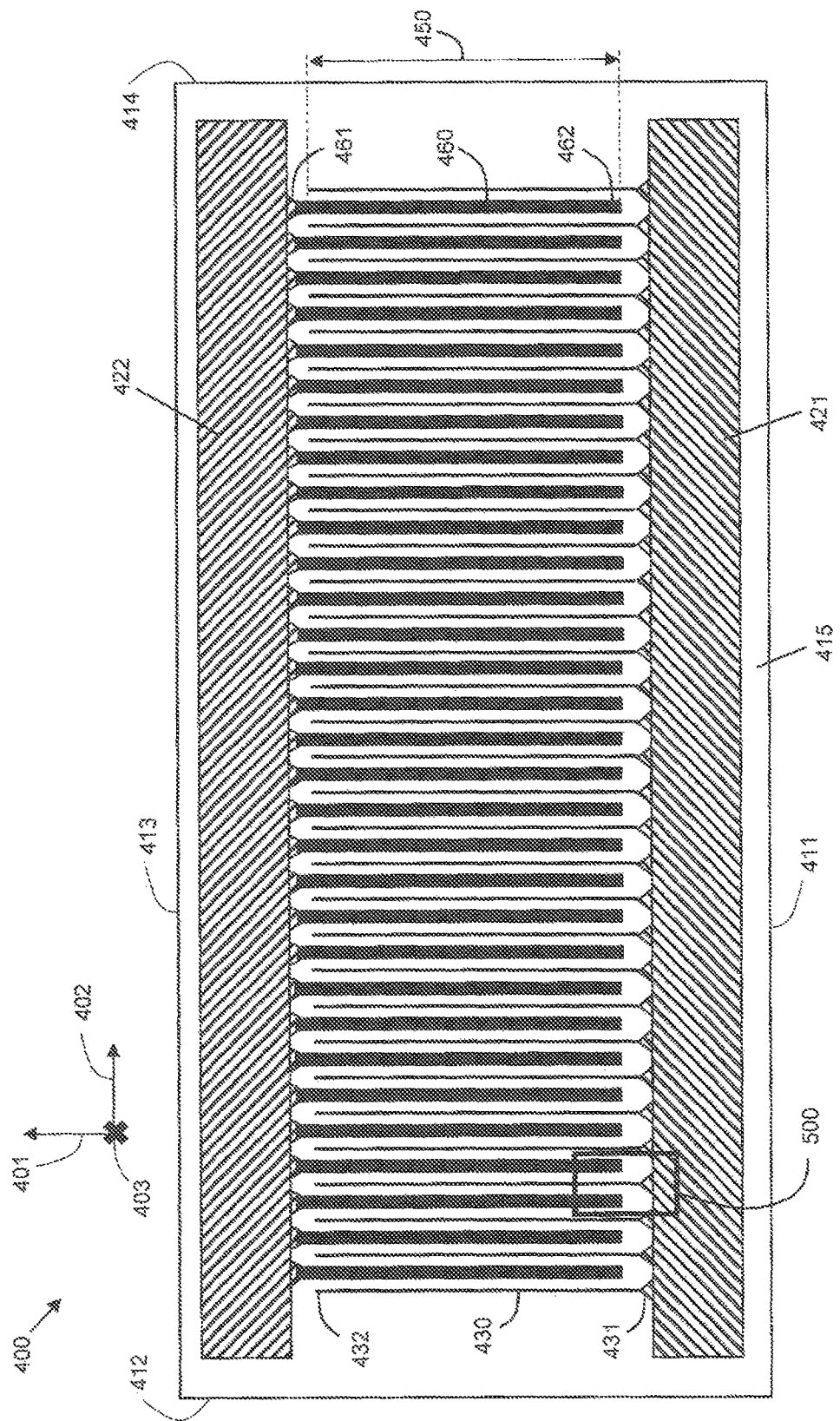
FIG. 4 is a top view of an example of a power transistor die, in accordance with an example embodiment.
Figure 5:
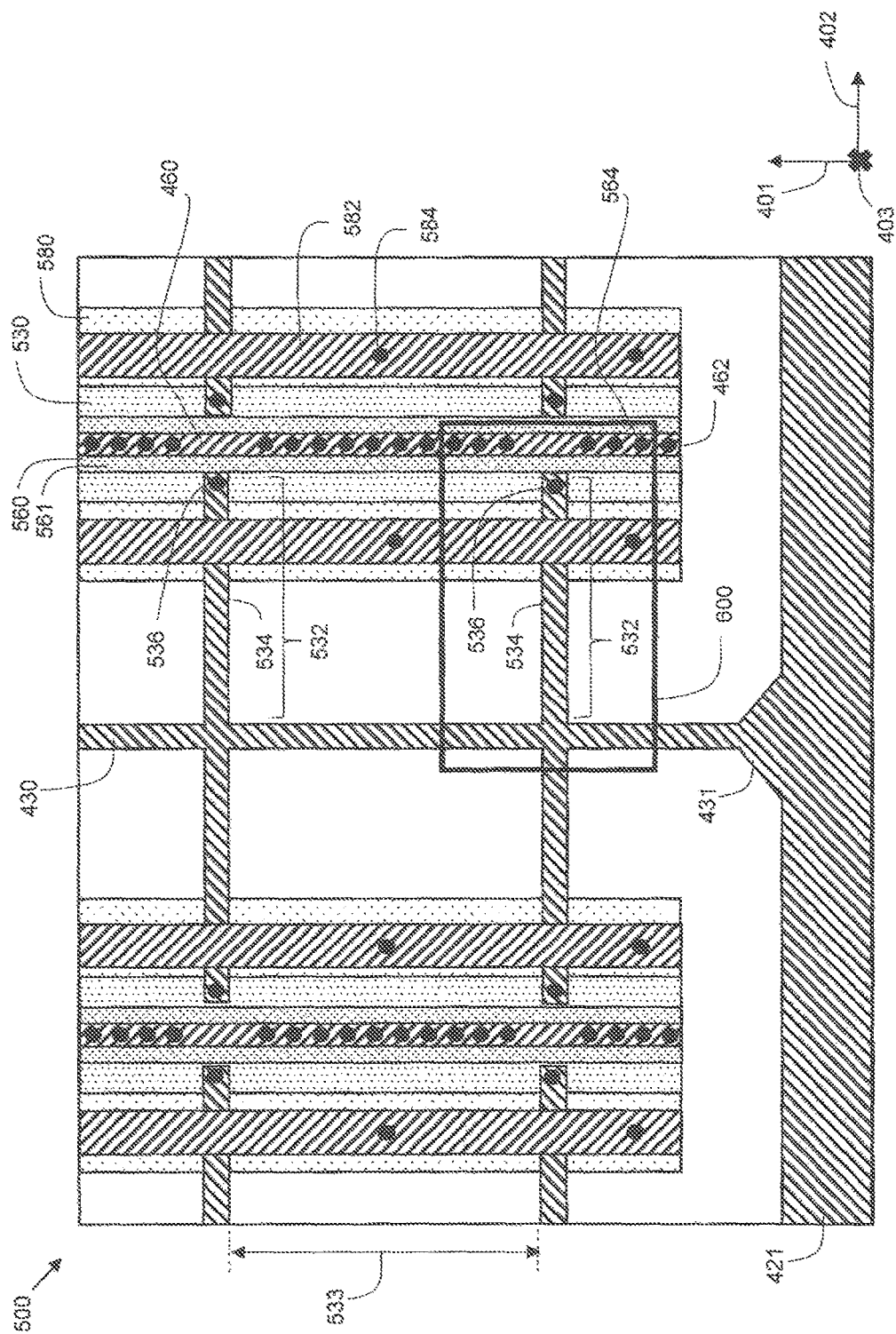
FIG. 5 is an enlarged view of a portion of the power transistor die of FIG. 4.
Figure 6:
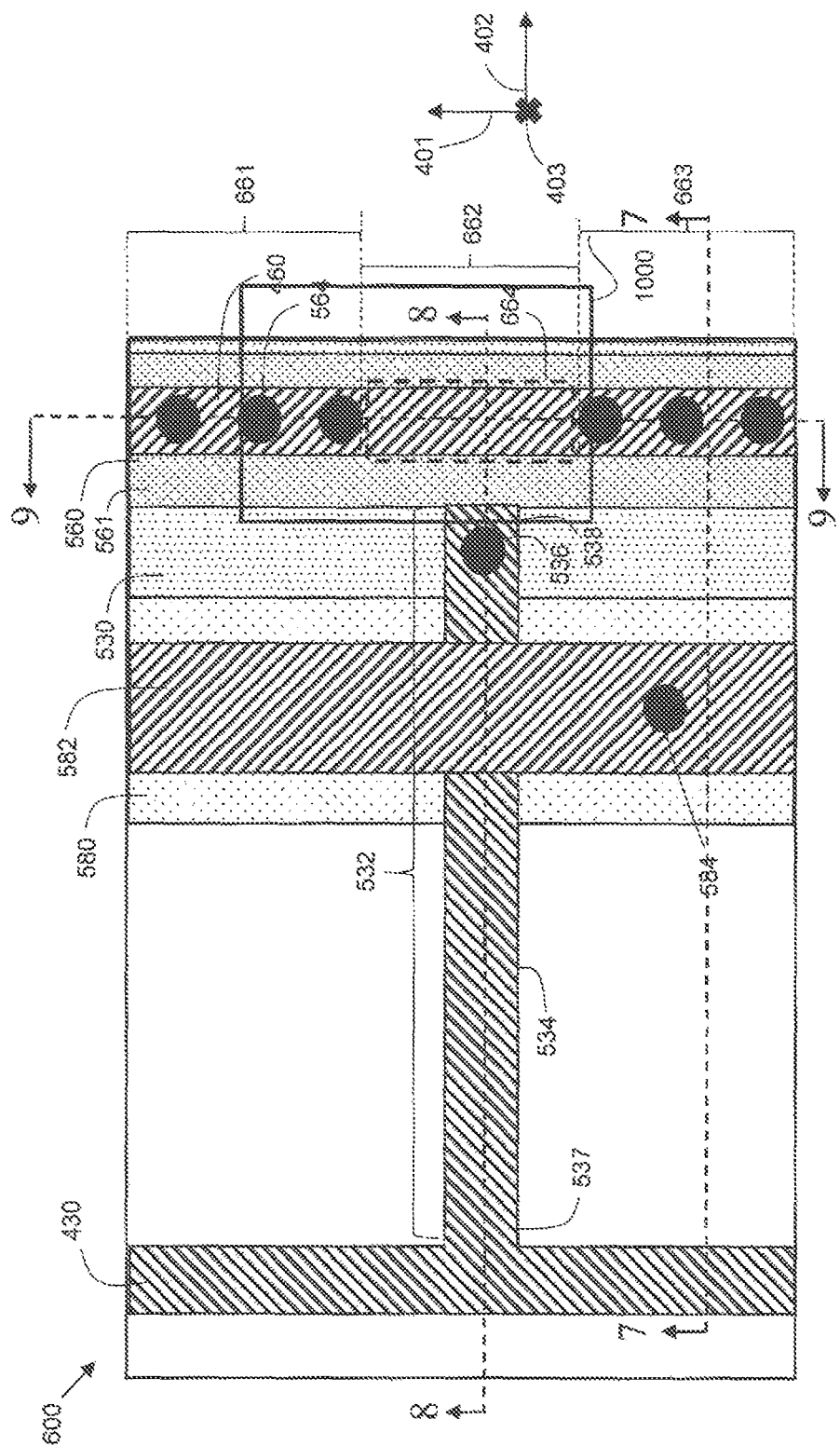
FIG. 6 is an enlarged view of a portion of the power transistor die of FIG. 5.
Figure 7:
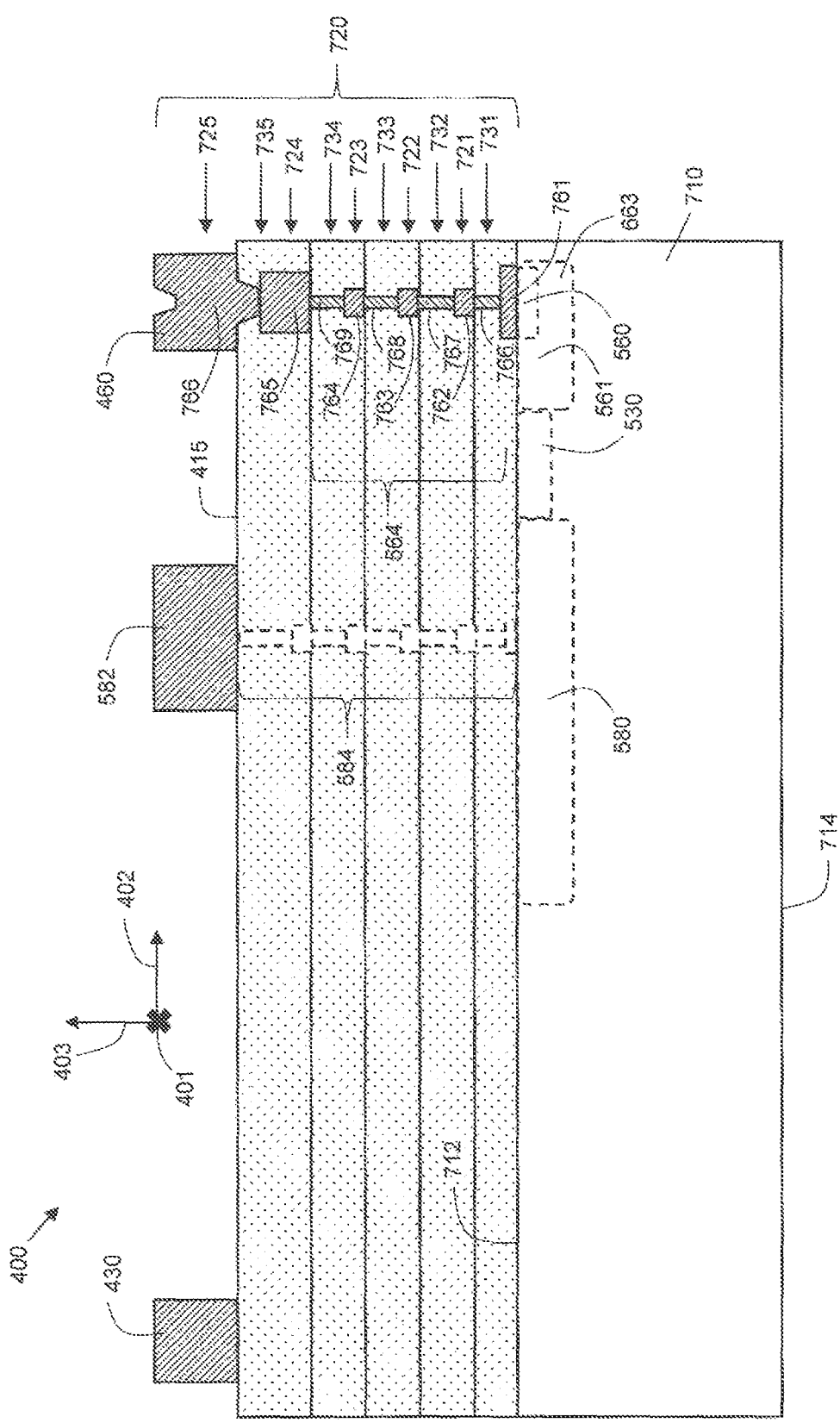
FIG. 7 is a cross-sectional, side view of the power transistor die of FIG. 6 along line 7-7.
Figure 8:
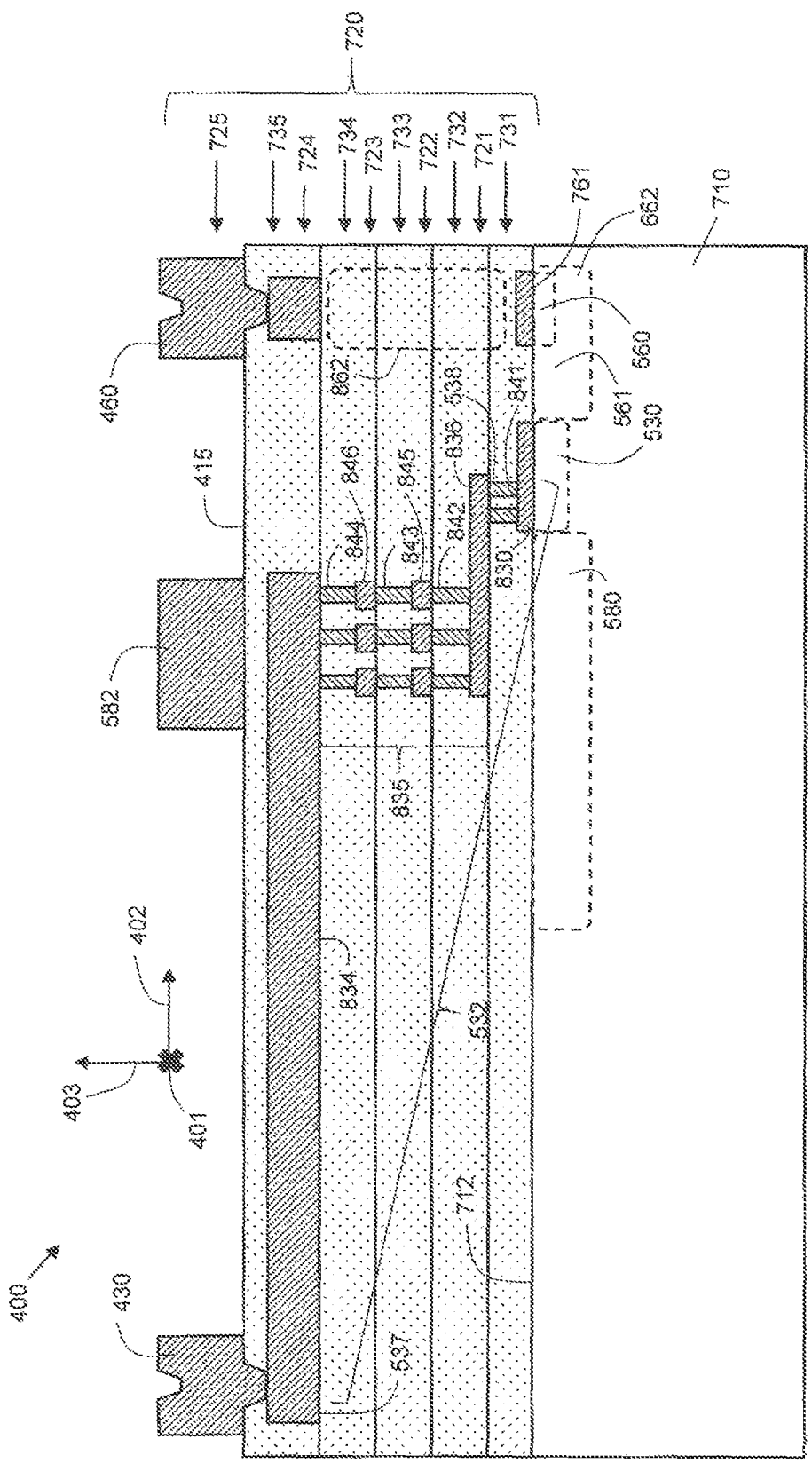
FIG. 8 is a cross-sectional, side view of the power transistor die of FIG. 6 along line 8-8.
Figure 9:
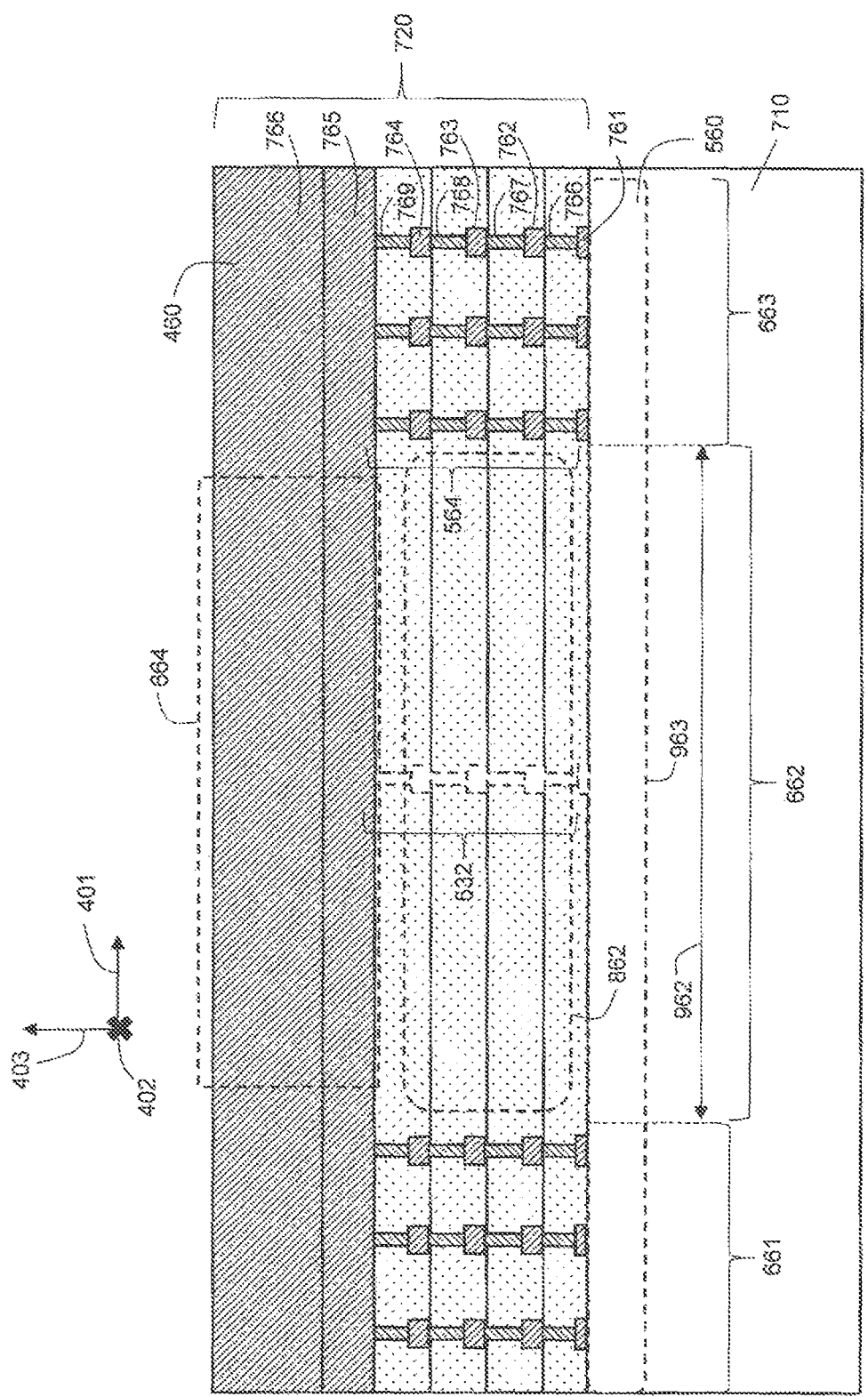
FIG. 9 is a cross-sectional, side view of the power transistor die of FIG. 6 along line 9-9.
Figure 10:
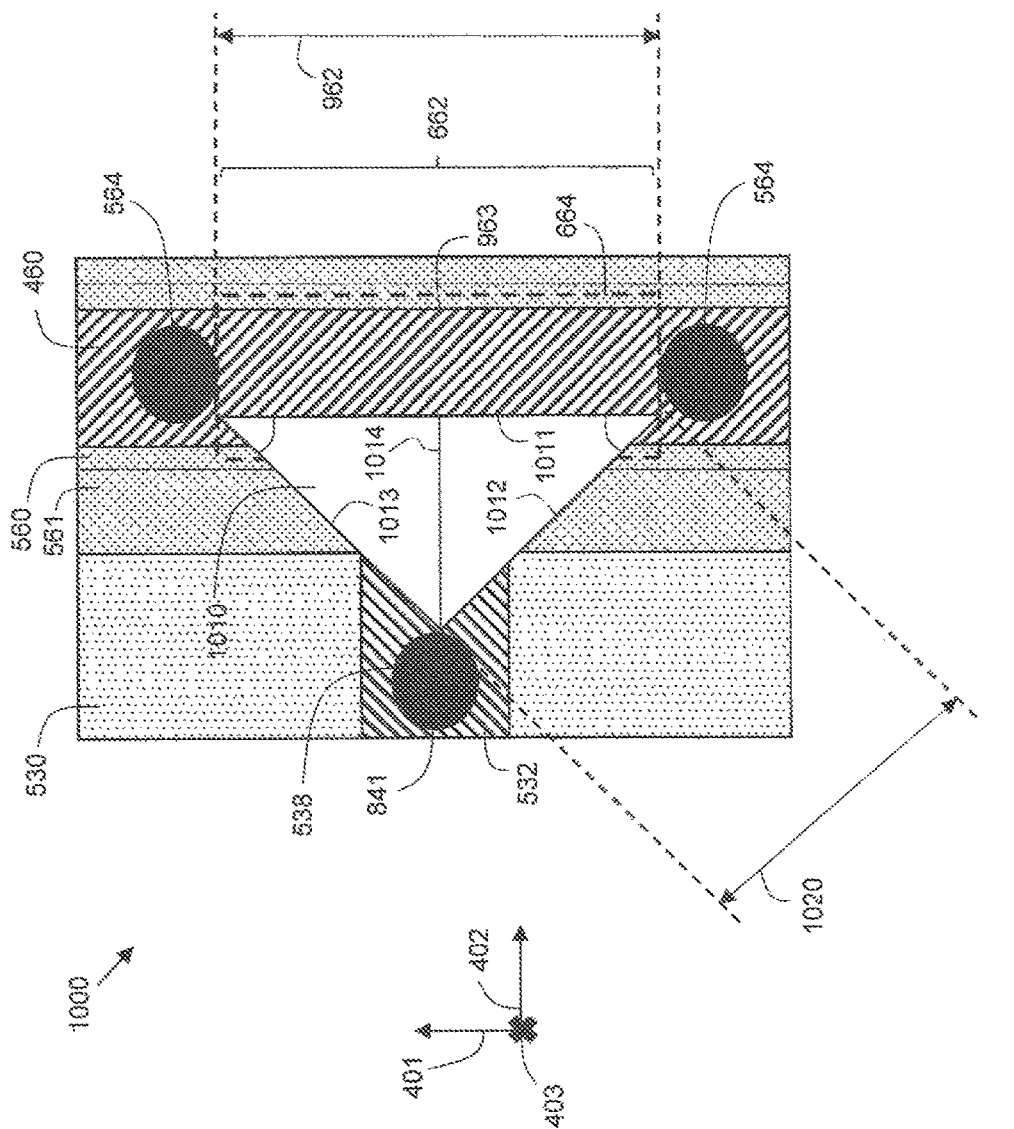
FIG. 10 is an enlarged view of a portion of the power transistor die of FIG. 6.

FIG. 4 is a top view of an example of a power transistor die 400 (e.g., transistor 220, FIG. 2), in accordance with an example embodiment. FIG. 4 should be viewed in conjunction with FIGS. 5 and 6, where FIG. 5 is an enlarged top view of a portion of the device 400 of FIG. 4 that is surrounded by box 500, and FIG. 6 is a further enlarged top view of the portion 500 of the die of FIG. 5 that is surrounded by box 600. Reference also will be made to FIGS. 7-9, which include various cross-sectional views taken along lines 7-7, 8-8, and 9-9 of the portion 600 of the die 400 depicted in FIG. 6. Finally, FIG. 10 is a further enlarged top view of the portion 600 of the die 400 depicted in FIG. 6 that is surrounded by box 1000.

Although FIGS. 4-6 and 10 depict top views of the transistor die 400, it should be noted that some of the features shown in FIGS. 4-6 and 10 may be located in material layers underlying the top surface 415 of transistor die 400. Thus, such features actually may be hidden in an actual top view. However, for clarity of description and enhanced understanding, features that otherwise may be hidden are depicted in FIGS. 4-6 and 10. The extent to which various features actually are hidden below the top surface 415 of the transistor die 400 is more apparent in FIGS. 7-9. Orthogonal coordinate axes 401, 402, and 403 are included in FIGS. 4-10 to clarify the orientations of various features. The terms "vertical," "vertically," and "vertical direction," as used herein, mean a direction parallel to axis 403, or perpendicular to the top surface 415 of the device 400. Conversely, the terms "horizontal," "horizontally," and "horizontal direction," as used herein, mean a direction parallel to axes 401 and 402, or parallel to the surface 415 of the device 400.

Referring first to the top view of FIG. 4 and also to the cross-sectional view of FIG. 7, transistor die 400 includes a semiconductor substrate 710 with top and bottom surfaces 712, 714, and sides 411, 412, 413, 414 extending between the top and bottom surfaces 712, 714. Transistor die 400 also includes a build-up structure 720 formed over the top surface 712 of the substrate 710, where the exterior surface of the build-up structure 720 corresponds to the top surface 415 of the transistor die 400. In various embodiments, the semiconductor substrate 710 may comprise silicon, silicon-on-insulator (SOI), silicon-on-sapphire (SOS), gallium arsenide (GaAs), gallium nitride (GaN), GaN on silicon carbide, GaN on silicon, or other types of substrate materials. For example, the substrate 710 may have a thickness in a range of about 50 microns to about 100 microns (e.g., about 75 microns), although the substrate 710 may be thinner or thicker, as well. The substrate 710 may include, for example, a base semiconductor substrate and one or more additional semiconductor layers epitaxially formed on the surface of the base semiconductor substrate. In a particular example embodiment, the substrate 710 is a high-resistivity silicon substrate (e.g., a silicon substrate having bulk resistivity in a range of about 1000 ohm-centimeter (cm) to about 100,000 ohm-cm or greater). Alternatively, the substrate 710 may be a semi-insulating GaAs substrate (e.g., a GaAs substrate having bulk resistivity up to $10^8$ ohm-cm), or another suitable high-resistivity substrate. In such embodiments, electrical connections between the top and bottom substrate surfaces 712, 714 may be made using conductive through substrate vias (TSVs) (not illustrated). Alternatively, electrical connections between top and bottom substrate surfaces 712, 714 may be made using wrap-around terminations or using other conductive structures. Still other embodiments may be implemented using low-resistivity substrates.

Build-up structure 720 includes an alternating arrangement of a plurality of patterned conductive layers 721-725 and a plurality of dielectric layers 731-735, each of which is formed over and coupled to the top substrate surface 712. The exposed surface of the top layer of the build-up structure 720 corresponds to the top surface 415 of the device 400. For example, using nomenclature known in the semiconductor device manufacturing arts, the patterned conductive layer 721 closest to the top substrate surface 712 may correspond to the M1 layer (metal 1 layer), and the conductive layers 722-725 located sequentially farther from the top substrate surface 712 may correspond to the M2, M3, M4, and M5 layers, respectively. Conductive vias (e.g., vias 766-769, 841-844, FIGS. 7, 8) extend through the dielectric layers 731-735 to provide for electrical connection between the conductive layers 721-725, and to provide for electrical connection to conductive structures in electrical communication with doped semiconductor regions (e.g., drain region 560, channel region 530, and source region 580).

The conductive layers 721-725 may be formed from the same or different materials as each other, and may have the same or different thicknesses. According to an embodiment, lower metal layers (e.g., layers 721-723 corresponding to M1-M3) are formed from substantially the same materials, and have substantially the same thickness, whereas higher metal layers (e.g., layers 724, 725 corresponding to M4 and M5) may be formed from different materials than the lower metal layers, and the higher metal layers may be thicker to accommodate higher currents. For example, conductive layers 731-733 may be formed from aluminum-copper-tungsten (AlCuW) or other commonly-used conductive layer materials, and conductive layers 731-733 may have thicknesses in a range of about 0.3 microns to about 1.0 microns. In contrast, conductive layers 734 and 735 may be formed from one or multiple conductive material layers, where at least one of the layers is a relatively-thick conductive layer that is capable of carrying relatively high currents (e.g., a copper (Cu) layer). In a particular example embodiment, conductive layers 734 and 735 include both an AlCuW layer and a Cu layer. Conductive layers 734 and 735 may have thicknesses in a range of about 1.0 microns to about 10.0 microns, for example.

Although particular example materials and dimensional ranges are listed herein, layers 731-735 may be formed from different materials than the above-listed materials, and/or may have larger or smaller thicknesses than the above-given ranges, in other embodiments. In addition, although an example embodiment is described herein with five metal layers 731-735 (e.g., M1-M5), a device may have more or fewer metal layers, as well. For example, an alternate embodiment may include build-up structures with as few as three metal layers (e.g., M1-M3), or some other number of layers.

Referring to FIGS. 4 and 5, device 400 includes a plurality of transistor "fingers," where each finger is elongated in a direction that extends between sides 411 and 413 (i.e., parallel to axis 401, FIG. 4), and the multiple fingers are distributed in a direction that extends from side 412 to side 414 (i.e., parallel to axis 402). Although a particular number of transistor fingers is illustrated in FIG. 4, a transistor die may include more or fewer fingers, in other embodiments. Generally, the number of transistor fingers may be as few as 10 fingers to as many as 50 fingers, although a device may have fewer or more fingers, as well. In any event, each transistor finger includes:

a) a first current-carrying region 560 (e.g., a drain region) in the form of an elongated first doped semiconductor region at and below the top surface 712 of the semiconductor substrate 710, where region 560 is elongated in a direction parallel to axis 401. For example, region 560 may have a width (i.e., dimension parallel to axis 402) in a range of about 2 microns to about 4 microns (e.g., about 3 microns), although region 560 may have a smaller or larger width, as well;

b) a drift region 561 in which the first current-carrying region 560 is implanted, wherein the drift region 561 is at and below the top surface 712 of the semiconductor substrate 710, and region 561 is elongated in a direction parallel to axis 401. For example, region 561 may have a width (dimension between regions 530 and 560) in a range of about 1.0 microns to about 10.0 microns, although region 561 may have a smaller or larger width, as well;

c) a second current-carrying region 580 (e.g., a source region) in the form of an elongated second doped semiconductor region at and below the top surface 712 of the semiconductor substrate 710, where region 580 is elongated in a direction parallel to axis 401. For example, region 560 may have a width (i.e., dimension parallel to axis 402) in a range of about 5.0 microns to about 50 microns, although region 560 may have a smaller or larger width, as well;

d) a channel region 530 in the form of an elongated third semiconductor region at and below the top surface 712 of the semiconductor substrate 710 between the drift region 561 and the second current-carrying region 580, and where region 530 is elongated in a direction parallel to axis 401. For example, region 560 may have a width (i.e., dimension parallel to axis 402) in a range of about 0.1 microns to about 1.0 microns, although region 560 may have a smaller or larger width, as well;

e) a first current-carrying terminal (e.g., a drain terminal), which is electrically connected to the first current-carrying region 560, and which is formed from a first assembly of conductive features 460, 564 of the build-up structure 720, as will be described in more detail below;

f) a second current-carrying terminal (e.g., a source terminal), which is electrically connected to the second current-carrying region 580, and which is formed from a second assembly of conductive features 582, 584 of the build-up structure 720, as will be described in more detail below; and g) a control terminal (e.g., a gate terminal), which is electrically connected to the channel region 530, and which is formed from one or more gate structures (e.g., gate structure 830, FIG. 8) and a third assembly of conductive features 430, 532 of the build-up structure 720, as will be described in more detail below.

The lengths 450 of the fingers (i.e., dimension parallel to axis 401), and thus the lengths of each of the channel region 530, drain region 560, drift region 561, and source region 580 may be in the range of about 100 microns to about 2000 microns (e.g., about 500 microns), although the fingers may be shorter or longer, as well.

As most clearly depicted in FIG. 4, the control terminal of each finger includes an elongated conductive runner 430 (referred to herein as a "gate runner"), which extends parallel to axis 401 between a proximal end 431 and a distal end 432. The proximal end 431 of each gate runner 430 is electrically coupled to a common, conductive control terminal pad 421 (referred to herein as a "gate pad"). Similarly, the first current-carrying terminal of each finger includes an elongated conductive runner 460 (referred to herein as a "drain runner"), which extends parallel to axis 401 between a proximal end 461 and a distal end 432. The proximal end 461 of each drain runner 460 is electrically coupled to a common, conductive current-carrying terminal pad 422 (referred to herein as a "drain pad"). As illustrated in FIG. 4, the gate and drain runners 430, 460 are interdigitated, in that they are arranged in an alternating manner in a direction parallel to axis 402. As indicated in FIG. 7, the gate and drain runners 430, 460 may be formed from portions of one or more relatively high metal layers (e.g., M4 and/or M5 layers 724, 725).

The gate and drain pads 421, 422 also may be formed from portions of one or more relatively high metal layers (e.g., M4 and/or M5 layers 724, 725). According to an embodiment, the gate pad 421 and the drain pad 422 correspond to conductive landing pads (e.g., conductive landing pads 221, 222, FIG. 2), which are exposed at the top surface 415 of the transistor die 400, and are configured for attachment of bondwires (e.g., bondwires 216, 252, 254, FIG. 2). Accordingly, during operation of transistor die 400, an input RF signal may be provided by external circuitry to gate pad 421, and a resulting amplified output RF signal may be produced by the transistor die 400 at drain pad 422 for transmission to external circuitry.

As discussed in conjunction with FIG. 1, the source region 580 may be electrically coupled to a ground reference. In the transistor die 400 of FIG. 4, this may be achieved using conductive features of the build-up structure 720, and through substrate vias or doped sinker regions (not illustrated) that electrically connect the source region 580 to the bottom surface 714 of the die 400. When the die 400 is incorporated into a packaged device or other system (e.g., device 200, FIG. 2), a conductive layer (not shown) on the bottom surface 714 of the die may be coupled to the conductive top surface of a substrate (e.g., substrate 206, FIG. 2), and that substrate in turn may be grounded.

As indicated in FIGS. 5-7, to provide an electrically conductive path to a ground reference, the second current-carrying terminal (e.g., source terminal) of each finger also includes an elongated conductive runner 582 (e.g., a source runner), which extends parallel to axis 401 along the length of the finger. For example, the source runner 582 may be formed from portions of one or more relatively high metal layers (e.g., M4 and/or M5 layers 724, 725). In an embodiment, each source runner 582 is electrically connected to a source region 580 through conductive structures 584 (e.g., conductive source pillars), shown using dashed lines in FIG. 7, as conductive structure 584 would be behind the plane of the cross-section. Each conductive structure 584 may include a plurality of conductive vias and portions of metal layers 721-724, where each of the conductive structures 584 extend vertically from the source runner 582 to the source region 580. The source runner 582, in turn, may be electrically connected through additional vias (not shown) in the build-up structure, along with through substrate vias (not shown) or doped sinker regions, to the bottom surface 714 of the transistor die 400.

Details will now be discussed regarding the structures and the juxtaposition of features of the drain and gate terminals (or first current-carrying and control terminals), which may result in reduced parasitic feedback capacitance between the gate and drain terminals, $C_{gd}$, when compared with conventional devices. Referring first to FIGS. 4-7, and as mentioned earlier, each gate terminal includes an elongated conductive runner 430 (referred to herein as a "gate runner"), which extends parallel to axis 401, and which is physically and electrically coupled to the common gate pad 421. In addition, as most clearly illustrated in FIG. 5, each gate terminal includes a plurality of elongated tap structures 532 (referred to herein as "gate taps"), each of which extends in a perpendicular direction from the gate runner 430 toward the channel region 530 (i.e., parallel to axis 402). According to an embodiment, a gate runner 430 may have a length (i.e., dimension parallel to axis 401) between proximal and distal ends 537, 538 in the range of about 100 microns to about 2000 microns, although the length of a gate runner 430 may be smaller or larger, as well. A gate tap 532 may have a length (i.e., dimension between proximal and distal ends 537, 538 in a direction parallel to axis 402) in the range of about 25 microns to about 50 microns, although the length of a gate tap 532 may be smaller or larger, as well. The distance 533 along the length of gate runner 430 between adjacent gate taps 532 may be in the range of about 25 microns to about 200 microns (e.g., about 50 microns), although the distance between gate taps 532 may be smaller or larger, as well.

The gate taps 532 are depicted simply in FIGS. 5 and 6. In the simple depictions, each gate tap 532 is indicated to include a generally horizontal conductive structure 534 and a generally vertical conductive structure 536. In actuality, each gate tap 532 may include multiple horizontal conductive structures and multiple vertical conductive structures. The horizontal conductive structure(s) 534 extend from the gate runner 430 to the channel region 530 in a direction parallel to axis 402, and the vertical conductive structure(s) 536 extend through the dielectric layers (e.g., layers 731-735, FIG. 7) of the build-up structure 720 in a direction parallel to axis 403.

As a more detailed example, referring to FIG. 8, an embodiment of a gate tap 532 includes a first elongated trace 834 formed from a portion of a relatively-high metal layer (e.g., M4 layer 724), a second elongated trace 836 formed from a portion of a relatively-low metal layer (e.g., M1 layer 721), a plurality of conductive gate pillars 835 extending through the dielectric layers (e.g., dielectric layers 732-734) between the first and second traces 834, 836, and additional conductive vias 841 that contact a gate structure 830. For example, each gate pillar 835 may be formed from stacked conductive vias 842, 843, 844 and portions 845, 846 of metal layers 722, 723 between the vias 842-844. For example, the portions 845, 846 may be relatively small pads formed from patterned portions of metal layers 722, 723.

The gate-contacting conductive vias 841 may extend through the lowest dielectric layer (e.g., layer 731) to contact a gate structure 830 overlying the channel region 530. As will be discussed in more detail in conjunction with FIG. 10, the gate-contacting conductive vias 841 are the physically closest conductive features of the gate tap 532 to the drain region 560 (and thus the closest conductive features to the drain terminal). According to an embodiment, the "distal end" 538 of the gate tap 532 may be defined as the gate-contacting conductive via 841 that is physically closest to the drain region 560 (or to the drain terminal). The shortest distance between the distal end 538 of the gate tap 532 and the drain region 560 may be in a range of about 3 microns to about 15 microns (e.g., about 5 microns), in various embodiments, although the shortest distance may be smaller or larger, as well.

In the embodiment illustrated in FIG. 8, the inclusion of the second elongated trace 836 enables the gate pillars 835 to be positioned farther from the drain terminal (e.g., farther from drain pillars 564) than the gate-contacting conductive vias 841. This may significantly reduce the parasitic gate-drain feedback capacitance, $C_{gd}$. In other embodiments, the gate pillars may extend as a continuous stack all the way from the first elongated trace 834 to the gate structure 830 (e.g., the gate pillars include a vertical stack of all vias 841-844).

According to various embodiments, the conductive vias 841-844 of the gate tap 532 may have circular, elliptical, square, or rectangular cross-sections, and each may have a width or diameter in a range of about 0.4 microns to about 0.6 microns, although the width/diameter may be smaller or larger, as well. The metal layer portions 845, 846 between the vias 842-844 may be relatively small pads formed from patterned portions of metal layers 722, 723 (e.g., pads having widths/diameters in a range of about 0.6 microns to about 0.8 microns, although they may be narrower or wider).

Although a particular gate tap structure that includes a configuration of conductive features 834, 836, 841-844, 845, 846 is depicted in FIG. 8, alternate gate tap structures may be formed from more or fewer elongated traces and/or more or fewer conductive vias. Further, the arrangement of elongated traces and conductive vias may be different from the arrangement shown in FIG. 8. Either way, the gate tap 532 has a proximal end 537 connected to the gate runner 430, and a distal end 538 connected to the gate structure 830.

Referring again to FIGS. 4-7, the drain terminal of each finger includes an elongated conductive runner 460 (e.g., a drain runner), which extends parallel to axis 401 along the length of the finger. As shown in FIG. 4, each drain runner 460 is electrically connected at a proximal end 461 to the drain pad 422. For example, the drain runner 460 may be formed from portions of one or more relatively high metal layers (e.g., portions 755, 756 of M4 and/or M5 layers 724, 725). As discussed previously, the metal layers (e.g., layers 724, 725) from which the drain runner 460 is formed may be relatively thick, when compared with lower layers (e.g., layers 721-723), to provide for increased current-carrying capability, when compared with the current-carrying capability of the lower layers.

In an embodiment, each drain runner 460 is aligned in the vertical direction with an underlying drain region 560. Each drain runner 460 is electrically connected to the drain region 560 through a plurality of conductive structures 564 (e.g., conductive drain pillars). As illustrated in FIG. 7, which is a cross-section taken through a drain pillar 564, each drain pillar 564 includes a plurality of conductive vias 766-769 and portions 762-764 of metal layers 721-723, which are arranged in a stack that extends vertically from the drain runner 460 toward the drain region 560. According to various embodiments, the conductive vias 766-769 may have circular, elliptical, square, or rectangular cross-sections, each with a width or diameter in a range of about 0.4 microns to about 0.6 microns, although the width/diameter may be smaller or larger, as well. The metal layer portions 762-764 between the vias 766-769 may be relatively small pads formed from patterned portions of metal layers 721-

723 (e.g., pads having widths/diameters in a range of about 0.6 microns to about 0.8 microns, although they may be narrower or wider). A drain region contact 761 electrically couples each drain pillar 564 to the drain region 560.

As shown most clearly in FIGS. 5 and 9, a plurality of drain pillars 460 electrically connect each drain runner 460 to the underlying drain region 560. However, according to an embodiment, the density and distribution of drain pillars 460 along a drain runner 460 (or along a drain region 560) is non-uniform across the length of the drain region 560. More particularly, and as will be discussed in more detail below, the density of drain pillars 460 is relatively low (e.g., down to and including zero density) along segments of the drain region 560 that are directly adjacent (in direction 402) to distal ends 538 of gate taps 532, and the density of drain pillars 460 is relatively high (and equally distributed) along segments of the drain region 560 that are not directly adjacent to the distal ends 538 of the gate taps 523.

Essentially, the drain region 560 may be considered to include a continuous sequence of adjoined drain region segments (e.g., segments 661, 662, 663) along its length (i.e., parallel to axis 401). Referring to FIGS. 6 and 9, some of the plurality of segments, such as segment 662, are considered to be "adjacent to" the distal end 538 of a gate tap 532. These segments are referred to herein as "tap-adjacent drain region segments." Conversely, other ones of the plurality of segments, such as segments 661 and 663, are considered to be "non-adjacent to" the distal ends of the gate taps. These segments are referred to herein as "non-tap-adjacent drain region segments." As used herein, a drain region segment is "adjacent to" the distal end 538 of a gate tap 532 when a horizontal axis extending from the distal end 538 of the gate tap 532 in a direction that is parallel with the long dimension of the gate tap (i.e., an axis parallel to axis 402) cuts through or over (in the vertical direction) a portion of the drain region segment. Defined another way, a tap-adjacent drain region segment is a segment, along the sequence of drain region segments, that is physically closest to the distal end 538 of a gate tap 532.

In an embodiment, and as most clearly indicated in FIG. 9, each tap-adjacent drain region segment 662 has a length 962 (in a direction parallel to axis 401) between about 10 microns and about 30 microns (e.g., about 20 microns), although the drain region segments 662 may be shorter or longer, as well. As indicated in FIGS. 6 and 9, each tap-adjacent drain region segment 662 may be centered with respect to each gate tap 532. More specifically, referring to FIG. 9, the center 963 of tap-adjacent drain region segment 662 is aligned with the gate tap 532, or at the very least is aligned with the distal end 538 of the gate tap 532. Note that, in FIG. 9, the gate tap 532 is shown using dashed lines, as the gate tap 532 would be behind the plane of the cross-section.

Each non-tap-adjacent drain region segment 661, 663 may be significantly longer than the tap-adjacent drain region segments 662. For example, each non-tap-adjacent drain region segment 661, 663 may have a length that is less than the distance 533 between adjacent gate taps 532 by an amount that is approximately equal to the width 962 of a tap-adjacent drain region segment 662. For example, when the distance 533 between adjacent gate taps 532 is about 50 microns, and when the length 962 of a tap-adjacent drain region segment 662 is about 20 microns, the length of a non-tap-adjacent drain region segment 661, 663 may be about 30 microns.

As shown in FIGS. 6, 7, and 9, drain pillars 564 extend vertically through portions of the build-up structure 720 between the drain runner 460 and the underlying, non-tap-adjacent drain region segments 661, 663. These drain pillars 564 may be evenly-spaced along the length of each non-tap-adjacent drain region segment 661, 663 (e.g., the drain pillars 564 have a first density along the segments 661, 663). For example, adjacent drain pillars 564 may be spaced-apart about every 1.0 microns to 5.0 microns along the length of a non-tap-adjacent drain region segment 661, 663. Conversely, as shown in FIGS. 6, 8, and 9, no drain pillars 564 are present in portions 862 of the build-up structure 720 that are located directly between a tap-adjacent drain region segment 662 and a segment (e.g., segment 664) of the drain runner 460 directly above the tap-adjacent drain region segment 662. In other words, these portions 862 of the build-up structure 720 that overlie the tap-adjacent drain region segments 662 are devoid of drain pillars 564 interconnecting the drain region 560 and the drain runner 460. In other embodiments, one or more drain pillars 564 may be present in these portions 862 of the build-up structure 720, but the density of the drain pillars 564 along the tap-adjacent drain region segments 662 is significantly less (e.g., at least 50 percent less) than the density of drain pillars 564 along the non-tap-adjacent drain region segments 661, 663.

The geometrical relationship between the drain tap 532 and the drain contact will be explained with more precision in conjunction with FIG. 10, which is an enlarged view of the portion 600 of device 400 surrounded by box 1000 in FIG. 6. FIG. 10 specifically shows an isosceles triangle 1010 transposed over a portion of the device 400 that includes the distal end 538 of a gate tap 532 (e.g., gate-contacting via 841), a tap-adjacent drain region segment 662, a segment 664 of the drain runner 460 directly above the tap-adjacent drain region segment 662, and drain pillars 564 on either side of the tap-adjacent drain region segment 662. Although an isosceles triangle 1010 is depicted in FIG. 10, indicating that the distal end 538 of a gate tap 532 may be adjacent to the center 963 of a tap-adjacent drain region segment 662, the distal end 538 of a gate tap 532 may be off-center from the center 963 of a tap-adjacent drain region segment 662, in other embodiments (e.g., legs 1012, 1013 may be of different lengths).

The base 1011 of the triangle 1010 represents the distance, Ddp, between the drain pillars 564 on either side of the tap-adjacent drain region segment 662, or the length 962 of the tap-adjacent drain region segment 662. The legs 1012, 1013 represent the distance 1020, Dt-dp, between the distal end 538 of the gate tap 532 (or the closest gate contacting via 841 to the drain region 560) and the nearest drain pillar 564 to the distal end 538 of the gate tap 532. The height 1014, H, of the triangle 1010 approximates the shortest distance between the distal end 538 of the gate tap 532 and the drain region 560.

An equation based on the Pythagorean theorem defines the distance 1020 between the distal end 538 of the gate tap 532 and the nearest drain pillar 564 as:

$$Dt\text{-}dp = \sqrt{(\frac{1}{2}Ddp)^2 + H^2}$$

For example, in a device in which the height, H, is 5 microns, and the distance, Ddp, between the drain pillars 564 across region 662 is 20 microns, the distance 1020, Dt-dp, between the distal end 538 of the gate tap 532 and the nearest drain pillar 564 is about 11.2 microns. According to various embodiments, the shortest distance between the distal end 538 of the gate tap 532 and the drain region 560 (e.g., the height 1014 of triangle 1010) is in a range of about 15 percent to about 75 percent (e.g., about 25 percent, as in the above-given example) of the length 962 of the tap-adjacent drain region segment 662, although this distance could be shorter or longer, as well.

By including tap-adjacent drain region segments 662 with low- or zero-density of drain pillars 564, electromagnetic coupling between the gate tap 532 and the drain terminal may be significantly reduced, when compared with conventional devices. Accordingly, the parasitic feedback capacitance between the gate and drain structures, $C_{gd}$, also may be significantly reduced, when compared with conventional devices. The resulting, relatively low $C_{gd}$ may significantly improve device performance (e.g., device gain and stability), when compared with conventional devices.

Figure 11:
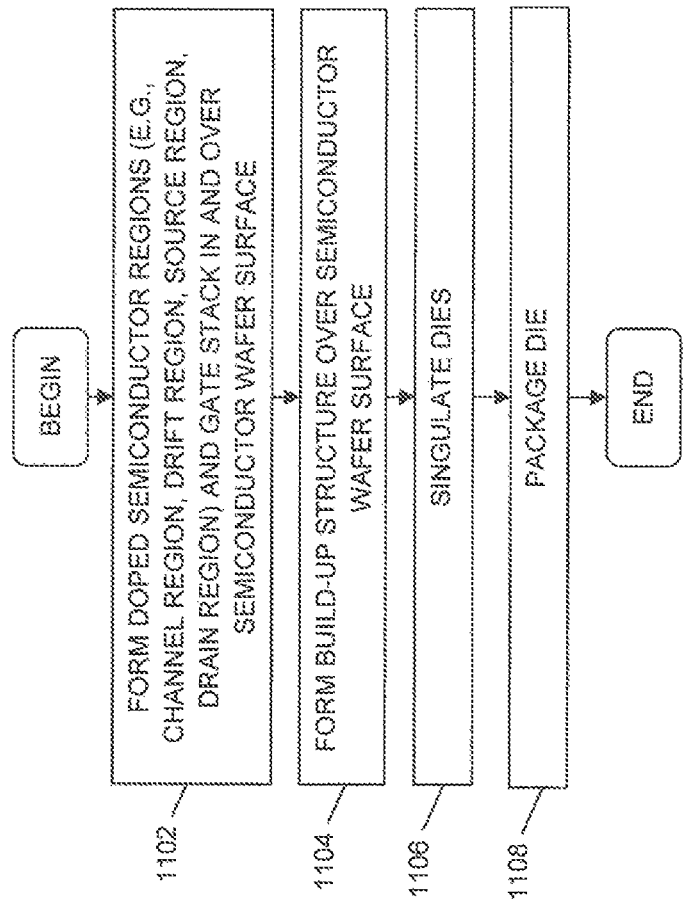
FIG. 11 is a flowchart of a method of manufacturing a power transistor die, in accordance with an example embodiment.

FIG. 11 is a flowchart of a method of manufacturing a device (e.g., device 200, FIG. 2) that includes a transistor die (e.g., die 400, FIG. 4), in accordance with an embodiment. In blocks 1102 and 1104, wafer manufacturing techniques are used to fabricate a wafer that includes a multitude of instances of the above-described transistor die (e.g., a multitude of die sites, each of which includes the circuitry of die 400). The method may begin, in block 1102, by forming a plurality of doped semiconductor regions (e.g., regions 530, 560, 561, and 580) in and at the top surface of a semiconductor wafer (e.g., corresponding to top surface 712 of semiconductor substrate 710. As discussed previously, the regions correspond to a channel region (e.g., channel region 530), a drain region (e.g., drain region 560), a drift region (e.g., drift region 561), and a source region (e.g., source region 580). Additional or differently configured or doped regions also or alternatively may be formed. Some or all of the regions may be elongated regions, each configured to be part of a transistor finger.

The method also includes forming a gate structure (e.g., gate 830, FIG. 8) over the channel region (e.g., channel region 530). For example, the gate structure may be formed by sequentially forming a dielectric layer, a polysilicon layer, and a metal interconnect layer on the top surface 712 of the semiconductor substrate 710, and performing a patterned etching process to define the gate structure.

In block 1104, a build-up structure (e.g., build-up structure 720) is formed on the top surface of the semiconductor substrate. For example, the build-up structure 720 may include a plurality of patterned conductive layers and dielectric layers. The build-up structure is formed to include a drain terminal for each finger, where the drain terminal includes a plurality of drain pillars (e.g., drain pillars 564, FIGS. 5-7) that electrically connect to the drain region (e.g., drain region 560, FIG. 5). The build-up structure is also formed to include a gate terminal for each finger, where each gate terminal includes a plurality of gate taps (e.g., gate taps 532, FIGS. 5, 6, and 8). As described in detail above, the build-up structure is devoid of drain pillars in areas of the drain region that are adjacent to the distal end of a gate tap, or the density of drain pillars in such areas is significantly lower than the density of drain pillars in areas of the drain region that is not adjacent to the distal end of a gate tap. Once the transistor wafer fabrication is complete, the wafer may be singulated, in block 1106, to create individual transistor die (e.g., die 400, FIG. 4).

In block 1108, the die may then be packaged. According to an embodiment, the device includes an air-cavity package, and packaging essentially includes coupling an isolation structure (e.g., isolation structure 208, FIG. 2) and each singulated die to a leadframe (e.g., including a flange 206 and leads 202, 204, FIG. 2), coupling additional components (e.g., capacitors 214, 256, FIG. 2) to the leadframe, electrically connecting the components (e.g., using wirebonds 212, 216, 252, 254, FIG. 2), and capping the device (e.g., with cap 310, FIG. 3). In alternate embodiments, the device includes an encapsulated package, in which the isolation structure and cap are replaced with plastic encapsulant material that covers the die and flange top surface, and secures the leads in a fixed orientation with respect to the die. The packaged device may then be incorporated into a larger electrical system (e.g., amplifier 100, FIG. 1).

An embodiment of a transistor die includes a semiconductor substrate having a top substrate surface, an elongated drain region at the top substrate surface that extends parallel to a first axis, an elongated channel region at the top substrate surface that extends parallel to the elongated drain region, and a build-up structure formed from a plurality of alternating dielectric layers and patterned conductive layers over the top substrate surface. The drain region includes contiguous first, second, and third drain region segments, with the second drain region segment being located between the first and third drain region segments. The build-up structure includes a conductive gate tap and a drain terminal. The conductive gate tap extends perpendicular to the first axis, and includes a distal end that is coupled to a gate structure over the elongated channel region. The second segment of the drain region is adjacent to the distal end of the conductive gate tap. The drain terminal that includes a drain runner formed from one or more portions of the patterned conductive layers, wherein the drain runner is vertically aligned with the drain region, a plurality of first drain pillars electrically connecting the drain runner and the first drain region segment, and a plurality of second drain pillars electrically connecting the drain runner and the third drain region segment. The build-up structure over the second drain region segment between the first and second drain pillars is devoid of electrical connections between the drain runner and the drain region.

A transistor die includes a semiconductor substrate having a top substrate surface, an elongated first doped semiconductor region at the top substrate surface that extends parallel to a first axis, an elongated channel region at the top substrate surface that extends parallel to the elongated first doped semiconductor region, a conductive gate tap that extends perpendicular to the first axis, and a first current-carrying terminal. The first doped semiconductor region includes contiguous first, second, and third segments, with the second segment being located between the first and third segments. The conductive gate tap includes a distal end that is coupled to a gate structure over the elongated channel region. The second segment of the first doped semiconductor region is adjacent to the distal end of the conductive gate tap. The first current-carrying terminal includes a conductive runner formed from one or more portions of a plurality of patterned conductive layers over the top substrate surface, a plurality of first vertical conductive structures electrically connecting the conductive runner and the first segment, and a plurality of second vertical conductive structures extending through the dielectric layers and electrically connecting the conductive runner and the third segment. The conductive runner is vertically aligned with the elongated first doped semiconductor region. Each of the first vertical conductive structures extends through a plurality of dielectric layers between the conductive runner and the first segment. A portion of the dielectric layers over the second segment between the first and second vertical conductive structures is devoid of electrical connections between the conductive runner and the first doped semiconductor region.

A method of manufacturing a transistor die includes forming an elongated drain region at a top substrate surface of a semiconductor substrate, forming an elongated channel region at the top substrate surface that extends parallel to the elongated drain region, and forming a build-up structure from a plurality of alternating dielectric layers and patterned conductive layers over the top substrate surface. The drain region is formed to extend parallel to a first axis, and the drain region includes contiguous first, second, and third drain region segments, with the second drain region segment being located between the first and third drain region segments. The build-up structure includes a conductive gate tap that extends perpendicular to the first axis, and a drain terminal. The conductive gate tap includes a distal end that is coupled to a gate structure over the elongated channel region, where the second segment of the drain region is adjacent to the distal end of the conductive gate tap. The drain terminal includes a drain runner formed from one or more portions of the patterned conductive layers, wherein the drain runner is vertically aligned with the drain region, a plurality of first drain pillars electrically connecting the drain runner and the first drain region segment, and a plurality of second drain pillars electrically connecting the drain runner and the third drain region segment. The build-up structure over the second drain region segment between the first and second drain pillars is devoid of electrical connections between the drain runner and the drain region.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A transistor die comprising:
   a semiconductor substrate having a top substrate surface;
   an elongated drain region at the top substrate surface that extends parallel to a first axis, wherein the elongated drain region includes contiguous first, second, and third drain region segments, with the second drain region segment being located between the first and third drain region segments;
   an elongated channel region at the top substrate surface that extends parallel to the elongated drain region;
   a build-up structure formed from a plurality of alternating dielectric layers and patterned conductive layers over the top substrate surface, wherein the build-up structure includes
      a conductive gate tap that extends perpendicular to the first axis, and that includes a distal end that is coupled to a gate structure over the elongated channel region, wherein the second drain region segment is adjacent to the distal end of the conductive gate tap, and
      a drain terminal that includes
         a drain runner formed from one or more portions of the patterned conductive layers, wherein the drain runner is vertically aligned with the elongated drain region,
         a plurality of first drain pillars electrically connecting the drain runner and the first drain region segment, and
         a plurality of second drain pillars electrically connecting the drain runner and the third drain region segment,
         wherein the build-up structure over the second drain region segment between the first and second drain pillars is devoid of electrical connections between the drain runner and the elongated drain region.

2. The transistor die of claim 1, wherein:
   the plurality of first drain pillars are spaced apart along a length of the first drain region segment; and
   the plurality of second drain pillars that are spaced apart along a length of the third drain region segment.

3. The transistor die of claim 2, wherein the plurality of first and second drain pillars are spaced apart every 1.0 microns to 5.0 microns along the lengths of the first and third drain region segments.

4. The transistor die of claim 3, wherein the second drain region segment has a length in a range of 10 microns to 30 microns.

5. The transistor die of claim 4, wherein a shortest distance between the distal end of the conductive gate tap and the elongated drain region is in a range of 3 microns to 15 microns.

6. The transistor die of claim 1, wherein a distance, Dt-dp, between the distal end of the conductive gate tap and a nearest drain pillar is:

$$Dt\text{-}dp=\sqrt{(\tfrac{1}{2}Ddp)^2+H^2},$$

where Ddp is a distance between the first and second drain pillars across the second drain region segment, and H is a shortest distance between the distal end of the conductive gate tap and the elongated drain region.

7. The transistor die of claim 6, wherein the shortest distance between the distal end of the conductive gate tap and the elongated drain region is in a range of 15 percent to 75 percent of a length of the second drain region segment.

8. The transistor die of claim 1, further comprising:
an elongated gate runner formed from one or more portions of the patterned conductive layers, wherein the elongated gate runner extends parallel to the first axis, and the conductive gate tap is electrically connected to the elongated gate runner.

9. The transistor die of claim 8, further comprising:
a plurality of additional conductive gate taps that are electrically connected to the elongated gate runner, wherein the additional conductive gate taps are coupled to other portions of the gate structure, and wherein the elongated drain region includes additional segments adjacent to the distal ends of the additional conductive gate taps, and wherein portions of the dielectric layers over the additional segments also are devoid of electrical connections between the drain runner and the elongated drain region.

10. The transistor die of claim 9, wherein a distance between adjacent pairs of the conductive gate tap and the additional conductive gate taps is in a range of 25 microns to 200 microns.

11. The transistor die of claim 8, wherein a length of the elongated gate runner is in a range of 100 microns to 2000 microns.

12. The transistor die of claim 1, wherein the conductive gate tap comprises:
a first conductive via connected to the gate structure and positioned a first distance from the elongated drain region;
a first conductive trace formed from a portion of a first conductive layer, wherein the first conductive trace is coupled to the first conductive via, and the first conductive trace extends in a direction away from the elongated drain region;
a plurality of second conductive vias coupled to the first conductive trace at a second distance from the elongated drain region that is significantly greater than the first distance; and
a second conductive trace formed from a portion of a second conductive layer, wherein the second conductive trace is coupled to the second conductive vias, and the second conductive trace extends in a direction away from the elongated drain region.

13. A transistor die comprising:
a semiconductor substrate having a top substrate surface;
an elongated first doped semiconductor region at the top substrate surface that extends parallel to a first axis, wherein the elongated first doped semiconductor region includes contiguous first, second, and third segments, with the second segment being located between the first and third segments;
an elongated channel region at the top substrate surface that extends parallel to the elongated first doped semiconductor region;

a conductive gate tap that extends perpendicular to the first axis, and that includes a distal end that is coupled to a gate structure over the elongated channel region, wherein the second segment of the elongated first doped semiconductor region is adjacent to the distal end of the conductive gate tap; and
a first current-carrying terminal comprising
a conductive runner formed from one or more portions of a plurality of patterned conductive layers over the top substrate surface, wherein the conductive runner is vertically aligned with the elongated first doped semiconductor region,
a plurality of first vertical conductive structures electrically connecting the conductive runner and the first segment, wherein each of the first vertical conductive structures extends through a plurality of dielectric layers between the conductive runner and the first segment, and
a plurality of second vertical conductive structures extending through the dielectric layers and electrically connecting the conductive runner and the third segment,
wherein a portion of the dielectric layers over the second segment between the first and second vertical conductive structures is devoid of electrical connections between the conductive runner and the elongated first doped semiconductor region.

14. The transistor die of claim 13, wherein:
the plurality of first vertical conductive structures comprises a plurality of first conductive pillars that are spaced apart along a length of the first segment; and
the plurality of second vertical conductive structures comprises a plurality of second conductive pillars that are spaced apart along a length of the third segment.

15. The transistor die of claim 13, further comprising:
an elongated gate runner formed from one or more portions of the plurality of patterned conductive layers over the top substrate surface, wherein the elongated gate runner extends parallel to the first axis, and the conductive gate tap is electrically connected to the elongated gate runner.

16. The transistor die of claim 15, further comprising:
a plurality of additional conductive gate taps that are electrically connected to the elongated gate runner, wherein the additional conductive gate taps are coupled to other portions of the gate structure, and wherein the elongated first doped semiconductor region includes additional segments adjacent to the distal ends of the additional conductive gate taps, and wherein portions of the dielectric layers over the additional segments also are devoid of electrical connections between the conductive runner and the elongated first doped semiconductor region.

17. A method of manufacturing a transistor die, the method comprising:
forming an elongated drain region at a top substrate surface of a semiconductor substrate, wherein the elongated drain region is formed to extend parallel to a first axis, and wherein the elongated drain region includes contiguous first, second, and third drain region segments, with the second drain region segment being located between the first and third drain region segments;
forming an elongated channel region at the top substrate surface that extends parallel to the elongated drain region;

forming a build-up structure from a plurality of alternating dielectric layers and patterned conductive layers over the top substrate surface, wherein the build-up structure includes
- a conductive gate tap that extends perpendicular to the first axis, and that includes a distal end that is coupled to a gate structure over the elongated channel region, wherein the second drain region segment is adjacent to the distal end of the conductive gate tap, and
- a drain terminal that includes
  - a drain runner formed from one or more portions of the patterned conductive layers, wherein the drain runner is vertically aligned with the elongated drain region,
  - a plurality of first drain pillars electrically connecting the drain runner and the first drain region segment, and
  - a plurality of second drain pillars electrically connecting the drain runner and the third drain region segment,
  - wherein the build-up structure over the second drain region segment between the first and second drain pillars is devoid of electrical connections between the drain runner and the elongated drain region.

18. The method of claim 17, wherein:
the plurality of first drain pillars are spaced apart along a length of the first drain region segment; and
the plurality of second drain pillars that are spaced apart along a length of the third drain region segment.

19. The method of claim 17, further comprising:
forming an elongated gate runner from one or more portions of the patterned conductive layers, wherein the elongated gate runner extends parallel to the first axis, and the conductive gate tap is electrically connected to the elongated gate runner.

20. The method of claim 19, further comprising:
forming a plurality of additional conductive gate taps that are electrically connected to the elongated gate runner, wherein the additional conductive gate taps are coupled to other portions of the gate structure, and wherein the first doped semiconductor region includes additional segments adjacent to the distal ends of the additional conductive gate taps, and wherein portions of the dielectric layers over the additional segments also are devoid of electrical connections between the drain runner and the elongated drain region.

* * * * *